United States Patent
Pethuraja et al.

(10) Patent No.: US 9,400,343 B1
(45) Date of Patent: Jul. 26, 2016

(54) HIGHLY DURABLE HYDROPHOBIC ANTIREFLECTION STRUCTURES AND METHOD OF MANUFACTURING THE SAME

(71) Applicant: Magnolia Optical Technologies, Inc., Woburn, MA (US)

(72) Inventors: Gopal G. Pethuraja, Albany, NY (US); Roger E. Welser, Providence, RI (US); Yash R. Puri, Lowell, MA (US); Ashok K. Sood, Brookline, MA (US)

(73) Assignee: Magnolia Optical Technologies, Inc., Woburn, MA (US)

( * ) Notice: Subject to any disclaimer, the term of this patent is extended or adjusted under 35 U.S.C. 154(b) by 0 days.

(21) Appl. No.: 14/701,200

(22) Filed: Apr. 30, 2015

Related U.S. Application Data (60) Provisional application No. 61/986,832, filed on Apr. 30, 2014.

(51) Int. Cl.
 *G02B 1/11* (2015.01)
 *G02B 1/18* (2015.01)
(52) U.S. Cl.
 CPC ... *G02B 1/11* (2013.01); *G02B 1/18* (2015.01)
(58) Field of Classification Search
 CPC .......... G02B 5/02–5/289; G02B 5/30–5/3091; G02B 5/0247; G02B 27/0006
 USPC .......... 359/577–590, 599, 601, 614; 427/162, 427/164–169
 See application file for complete search history.

(56) References Cited

U.S. PATENT DOCUMENTS

| | | | |
|---|---|---|---|
| 4,535,026 A | 8/1985 | Yoldas et al. | |
| 4,583,822 A | 4/1986 | Southwell | |
| 5,476,717 A * | 12/1995 | Floch | G02B 1/10 427/164 |
| 5,882,773 A * | 3/1999 | Chow | C23C 18/00 359/580 |
| 7,483,212 B2 | 1/2009 | Cho et al. | |
| 7,553,691 B2 | 6/2009 | Fatemi et al. | |
| 7,642,199 B2 | 1/2010 | Meredith et al. | |

(Continued)

OTHER PUBLICATIONS

Alemu, et al., "Dependence of Device Performance on Carrier Escape Sequence in Multi-Quantum-Well p-i-n Solar Cells", "Journal of Applied Physics", May 4, 2006, pp. 084506-1-084506-5, vol. 99, No. 084506, Publisher: American Institute of Physics, Published in: US.

(Continued)

*Primary Examiner* — Bumsuk Won
*Assistant Examiner* — Jeffrey Madonna
(74) *Attorney, Agent, or Firm* — Loginov & Associates, PLLC; William A. Loginov (57) ABSTRACT

Durable hydrophobic antireflection structures for optical elements, optical windows, and front sheets of encapsulated photovoltaic and photonic devices are disclosed which can minimize reflection losses over the entire accessible portion of the solar spectrum simultaneously provide self-cleaning and finger-print-free surface. Reduced reflectance and self-cleaning surfaces are resulted from coating the front sheet of encapsulated device with combination of nonporous and porous nanostructured materials such as silicon dioxide nanorods and PTFE. Step-graded antireflection structures can exhibit excellent omnidirectional performance, significantly outperforming conventional quarter wavelength and low-high-low refractive index coatings. Methods of constructing nanostructured durable optical coatings with hydrophobic surfaces are disclosed that can cover large-area ridged and flexible substrates.

3 Claims, 7 Drawing Sheets

(56) References Cited

U.S. PATENT DOCUMENTS

| | | | |
|---|---|---|---|
| 2003/0082399 A1 | 5/2003 | He et al. | |
| 2003/0121542 A1 | 7/2003 | Harneit et al. | |
| 2006/0165963 A1 | 7/2006 | Fleury et al. | |
| 2008/0013177 A1* | 1/2008 | Hatano | G02B 1/111 359/586 |
| 2008/0206470 A1* | 8/2008 | Thomas | C23C 14/022 427/402 |
| 2008/0223434 A1 | 9/2008 | Ikenoue et al. | |
| 2009/0324910 A1 | 12/2009 | Gemici et al. | |
| 2011/0168261 A1 | 7/2011 | Welser et al. | |
| 2012/0081792 A1* | 4/2012 | Neuffer | G02B 1/041 359/601 |
| 2013/0094093 A1* | 4/2013 | Tanaka | C03C 17/007 359/642 |
| 2013/0170044 A1* | 7/2013 | Mont | G02B 1/10 359/580 |
| 2013/0215513 A1* | 8/2013 | Liang | G02B 1/11 359/601 |
| 2013/0337161 A1* | 12/2013 | Akimoto | C09C 3/006 427/162 |
| 2014/0147654 A1* | 5/2014 | Walther | C23C 18/1212 428/312.6 |
| 2014/0261673 A1* | 9/2014 | Nair | G02B 1/11 136/256 |
| 2014/0272295 A1* | 9/2014 | Deshpande | G02B 1/12 428/142 |

OTHER PUBLICATIONS

Kim, et al., "GaInN Light-Emitting Diode With Conductive Omnidirectional Reflector Having a Low-Refractive-Index Indium-Tin Oxide Laye", "Applied Physics Letters", Jan. 3, 2006, pp. 013501-1-013501-3, vol. 88, No. 013501, Publisher: American Institute of Physics.

Mochizuki, et al., "GaInP/GaAs Collector-Up Tunneling-Collector Heterojunction Bipolar Transistors (C-Up TC-HBTS): Optimization of Fabricat", "Transactions on Electron Devices", Dec. 2000, pp. 2277-2283, vol. 47, No. 12, Publisher: IEEE, Published in: US.

Asbeck, et al., "Heterojunction Bipolar Transistor Technology", "Introduction to Semiconductor Technology: GaAs and Related Compounds", May 1990, p. 170; 179-187; 195-203, Publisher: John Wiley & Sons, Published in: US.

Henry, "Limiting Efficiencies of Ideal Single and Multiple Energy GAP Terrestrial Solar Cells", "Journal of Applied Physics", Apr. 9, 1980, pp. 4494-4500, vol. 51, No. 8, Publisher: American Institute of Physics, Published in: US.

Matheu, et al., "Metal and Dielectric Nanoparticle Scattering for Improved Optical Absorption in Photovoltaic Devices", "Applied Physics Letters", Sep. 18, 2008, pp. 113108-1-113108-3, vol. 93, No. 113108, Publisher: American Institute of Physics, Published in: US.

Xi, et al., "Optical Thin-Film Materials With Low Refractive Index for Broadband Elimination of Fresnel Reflection", "Letters", Mar. 2007, pp. 176-179, vol. 1, Publisher: Nature Publishing Group.

Dodd, et al., "Surface and Perimeter Recombination in GaAs Diodes: An Experimental and Theoretical Investigation", "Transactions on Electron Devices", Jun. 1991, pp. 1253-1261, vol. 38, No. 6, Publisher: IEEE, Published in: US.

Wei, et al., "Thermodynamic Limits of Quantum Photovoltaic Cell Efficiency", "Applied Physics Letters", 2007, pp. 223507-1-223507-3, vol. 91, No. 223507, Publisher: American Institute of Physics, Published in: US.

* cited by examiner

HIGHLY DURABLE HYDROPHOBIC ANTIREFLECTION STRUCTURES AND METHOD OF MANUFACTURING THE SAME

RELATED APPLICATIONS

This application claims the benefit of U.S. Provisional Application Ser. No. 61/986,832, filed Apr. 30, 2015, entitled HIGHLY DURABLE HYDROPHOBIC ANTIREFLECTION STRUCTURES AND METHOD OF MANUFACTURING THE SAME, the entire disclosure of which is herein incorporated by reference.

FIELD OF THE INVENTION

The present invention relates to optical elements, transparent optical windows for detectors, sensors, display devices and other optoelectronic devices; and to semiconductor-based photovoltaic energy converters, also known as "solar cells," and to the design and fabrication of the same.

BACKGROUND OF THE INVENTION

Transparent windows are employed in a wide range of defense and commercial applications, including optical lenses and photovoltaic cover glass. Glass, sapphire, and quartz are well-known materials used to form high transmittance optical windows for a wide range of applications. Because these materials have very low absorption coefficients over a wide range of photon energies, optical transmittance through glass, sapphire, and quartz windows is typically limited by reflection losses. In particular, Fresnel reflection losses in optical windows arise from the difference in index of refraction between air (n~1) and the window material (n~1.4-1.8). Although Fresnel reflection losses are typically relatively low at normal incidence, they can become quite substantial for off-angle light incidence. For example, Fresnel reflection from uncoated glass generally varies from over 4% at normal incidence to as much as 40% at an incident angle of 75°.

Reducing optical reflection from surfaces is highly desirable to many applications in optics. Reducing reflection is commonly achieved through coating or texturing the surface of interest. Numerous applications involving dielectric or semiconducting materials use the light that is transmitted through the material's surface. Examples of such an application are optical lenses, windows, photovoltaic devices, display devices, and photo-detectors. Glass (amorphous $SiO_2$) is an example of a dielectric material widely used in a variety of optical applications (e.g. lenses, windows) and as a front sheet for semiconductor optoelectronic devices.

Theoretically, it has been known for some time that Fresnel reflection losses can be minimized between two media by varying the index of refraction across the interface. Until recently, however, the unavailability of materials with the desired refractive indices, particularly materials with very low refractive indices, prevented the implementation of step-graded refractive index designs.

SUMMARY OF THE INVENTION

The disadvantages of the prior art can be overcome by providing a durable hydrophobic antireflection structure for a front sheet of encapsulated photovoltaic and photonic devices that minimize reflection losses over the entire accessible portion of the solar spectrum and provide self-cleaning and finger-print free surfaces. Reduced reflectance results from coating the encapsulated device with porous nanostructured materials, e.g, materials having properties defined by features smaller than 100 nm, such as silicon dioxide ($SiO_2$) nanorods. Step-graded antireflection structures can exhibit excellent broadband, omnidirectional performance and significantly outperform conventional coatings. High porosity of nanostructured layer leads to poor abrasion resistance. Oblique angle deposition of low-index-materials, such as Polytetrafluoroethylene (PTFE), $MgF_2$, etc. creates nanostructured ultralow refractive index (e.g., refractive index less than 1.3) layer with low porosity and high abrasion resistance. Hydrophobic materials, such as PTFE, repel water and exhibit water contact angle greater than 90 degrees. Nanostructuring of hydrophobic materials can yield superhydrophobicity that exhibit water contact angle greater than 150 degrees.

In an illustrative embodiment, a photovoltaic or photonic device comprises a semiconductor device, an optically transparent front sheet of encapsulated semiconductor device, a step-graded hydrophobic antireflection coating and a topmost nonporous layer that is constructed and arranged to be an abrasion resistant hydrophobic coating. According to the illustrative embodiment, the step-graded antireflection coating includes a multi-layer structure of transparent materials. Each of the layers in the multi-layer structure below the abrasion resistant hydrophobic coating has a refractive index that varies between the refractive index of the front sheet and the refractive index of air. According to an illustrative embodiment, the index of refraction is varied from the front sheet to ambient air over three steps comprising, respectively: approximately 85 nm of porous $SiO_2$ (n~1.37), approximately 40 nm of PTFE film (n~1.3) and approximately 120 nm of porous nanostructured PTFE film (n~1.15). The topmost nonporous layer can comprise a thin (approximately 5-20 nm) top nonporous layer of $Al_2O_3$, $SiO_2$, $PTFE/SiO_2$ or $PTFE/Al_2O_3$ composite material.

BRIEF DESCRIPTION OF THE DRAWINGS

The invention description below refers to the accompanying drawings, of which.

DETAILED DESCRIPTION

Ultra-high, broadband transmittance through coated glass windows has been demonstrated over a wide range of incident angles. The measured improvements in transmittance result from coating the windows with materials comprising porous nanorods. The use of porous nano-materials fabricated by, for example, oblique-angle deposition, enables a tunable refractive index, flexibility in choice of material, simplicity of a physical vapor deposition process, and the ability to optimize the coating for any substrate-ambient material system. A multi-layer coating adapted for a glass substrate is fabricated and characterized as described below. For multi-layer antireflective (AR) coatings, according to an illustrative embodiment, the refractive index of the layers is step-graded (e.g., decreased sequentially from layer to layer in discrete steps), from the substrate value, approximately 1.47, to a value of approximately 1.08, according to the various illustrative embodiments.

Figure 1:
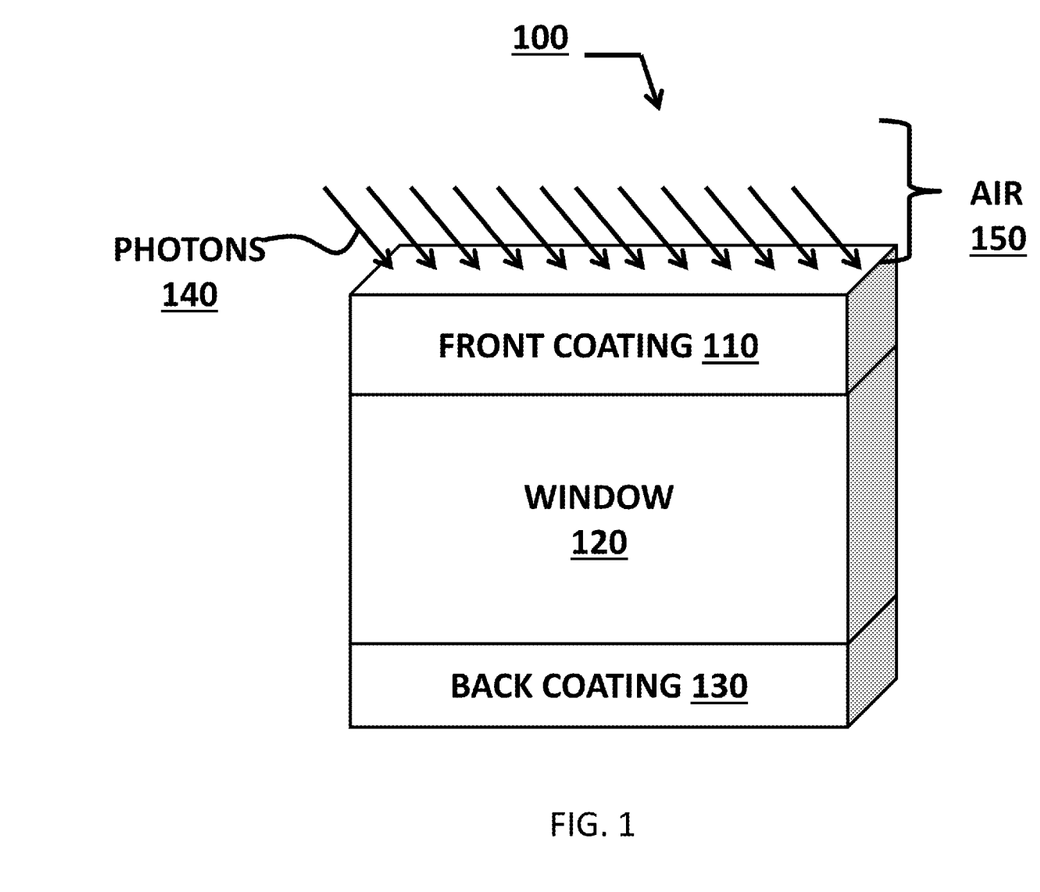
FIG. 1 is a schematic side cross-sectional view of a double-side coated optical window, according to an illustrative embodiment.

FIG. 1 depicts a cross-sectional view illustrating a high transmittance window structure 100 comprising a transparent optical window 120 having an antireflection structure 110 and 130 coated, respectively, on each of the front and back sides of the window 120. According to the illustrative embodiment, the front coating 110 is deposited on a device window 120 configured and arranged to face a light source, which provides a readily available source of photons 140. The front coating 110 can be a multiple-layer coating comprising a plurality of optical films, and the multiple-layer coating defines an index of refraction between air 150 and the window 120. The multi-layer coating can comprise two, three, or more layers, up to a plurality of layers, defining refractive indices as appropriate to achieve the desired transmittance, as will be described in greater detail below. A back coating 130 is applied to the back side of the window 120 and comprises materials possessing indices of refraction between that of the window 120 and air 150. Although photons 140 are illustratively shown as a series of a single direction of photon stream, it should be clear to those skilled in the art that the various, illustrative, and alternate embodiments will function with various varying degrees and/or amount of incident of light or source of photon energies.

In various embodiments, front transparent AR coating 110 and back transparent AR coating 130 are configured and arranged to reduce the reflection of incident photons at the material interface between air 150 and the window 120. In the various embodiments, front coating 110 and back coating 130 can be carried out by one or more deposition materials and methods of manufacturing and/or deposition. Transparent antireflection coating structures can comprise a single layer or multiple layers of materials having an index of refraction intermediate between the window 120 and the media in which the incident photons are delivered, which by way of example is illustrated as air 150 in FIG. 1. Single-layer transparent antireflection coating structures are generally characterized by enhanced transmittance around a single wavelength of light when the light is at normal incidence to the transparent antireflection coating structure surface. In alternate embodiments, graded-index coatings with variable-index profiles are utilized. The various illustrative and alternate embodiments utilize optical materials with very low refractive indices that closely match the refractive index of air, which historically have not been utilized.

Oblique-angle deposition is utilized as an effective technique for tailoring the refractive index of a variety of thin film materials. Oblique-angle deposition is a method of growing nanostructured, porous thin films, and hence thin films with low-refractive index (low-n), enabled by surface diffusion and self-shadowing effects during the deposition process. In oblique-angle deposition, random growth fluctuations on the substrate produce a shadow region that incident vapor flux cannot reach, and a non-shadow region where incident flux deposits preferentially, thereby creating an oriented rod-like structure with high porosity. The deposition angle, defined as the angle between the normal to the sample surface and the incident vapor flux, results in the formation of nanorod structures that are tilted relative to the sample surface. Given that the gaps between the nanorods can be much smaller than the wavelength of visible and infrared light, the nanostructured layers act as a single homogeneous film with a refractive index intermediate between air and the nanorod material, decreasing in refractive index with increasing porosity.

Unlike other methods, the use of porous nano-materials fabricated by oblique-angle deposition offers advantages such as tunability of refractive index, flexibility in choice of material, simplicity of a physical vapor deposition process, and the ability to optimize the coating for any substrate-ambient material system.

Both conducting and non-conducting graded-index antireflection coatings that are broadband and omni-directional can be produced using this deposition technique. Both oblique angle deposition and co-sputtering are material synthesis techniques that can be used to construct multiple layer, graded refractive index coatings to minimize reflection losses. It is contemplated in illustrative embodiments that these processes can be adapted to minimize reflection losses for optical widows.

Graded index multi-layer AR coatings constructed from a single material, e.g., porous silica (porous $SiO_2$) have poor abrasion resistance due to use of layers with higher porosity. Hence, the multi-layer coatings constructed from two or more materials can provide a graded-index multilayer structure with low porosity and high abrasion resistance.

Notably, the multi-layer AR coating can be constructed from two materials, porous silica (porous $SiO_2$) and another low-index-material, according to the illustrative embodiment. Silica is particularly adept for use as AR coating on a glass, quartz, or sapphire substrate, as it is native, stable and robust. $SiO_2$ coatings are well known for their long-term stability and high transmittance over a wide spectral range. However, conventional nonporous $SiO_2$ has a refractive index around 1.47, and thus is not an effective antireflection material for glass windows, which have a refractive index near 1.5. However, the refractive index of porous $SiO_2$ can be reduced to values of 1.1 or lower by increasing the porosity. Thus, porous $SiO_2$ is highly tunable to the desired refractive index. Oblique angle deposition enables the creation of a wide variety of step graded refractive index structures. U.S. patent application Ser. No. 12/946,580 entitled HIGH TRANSMITTANCE OPTICAL WINDOWS AND METHOD OF CONSTRUCTING THE SAME, filed Nov. 15, 2010, by Welser et al., which is herein incorporated by reference, and discloses step-graded antireflection structures for ultra-high, broadband transmittance through optical windows over a wide range of incident angles.

Nanostructured layers with high porosity have poor abrasion resistance. Graded index multi-layer structures with porosity of 60% or less can yield a high abrasion resistant antireflection structure. Such a durable multi-layer structure can be achieved by incorporating one or more low-indexmaterials into the multi-layer structure, such as PTFE (n~1.3), LiF (n~1.36), $MgF_2$ (n~1.38), $AlF_3$ (n~1.36), Cryolite (n~1.35), Chiolite (n~1.33), etc. Nanostructured porous layer of these low-index-materials can be created by oblique angle deposition method. These nanostructured layers are highly tunable to desire ultralow refractive index, e.g., refractive index less than 1.3, with preserving its mechanical reliability. PTFE is a fluoropolymer, durable organic material with hydrophobic properties. Nanostructured PTFE can create a hydrophobic surface, exhibiting water contact angle 130 degrees or higher, that repels water and/or oils, yielding self-cleaning and finger-print free surfaces.

Figure 2:
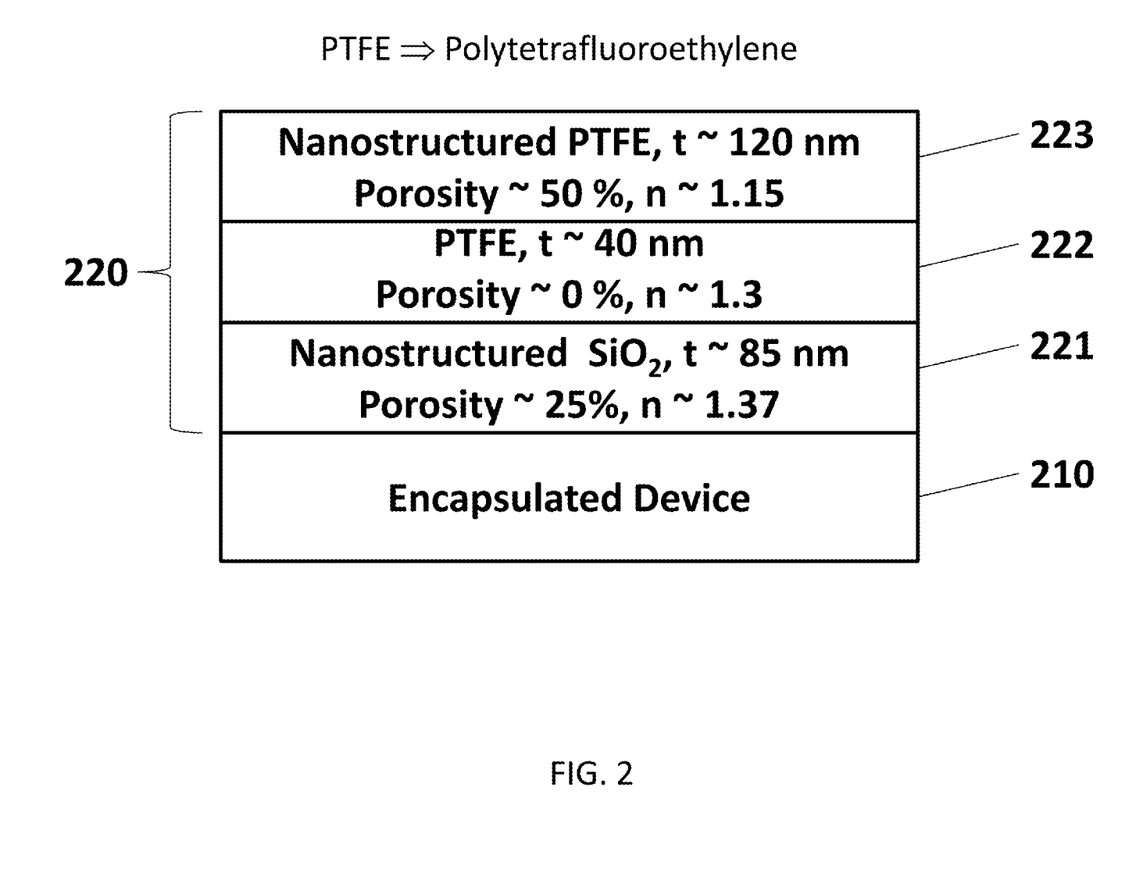
FIG. 2 is a schematic side cross-sectional view of an encapsulated semiconductor device coated with a multi-layer structure, according to an illustrative embodiment.

Reference is now made to FIG. 2 showing a semiconductor device comprising an encapsulated semiconductor material 210 coated with a hydrophobic nanostructured multi-layer structure 220. Step-graded antireflection structures similar to those shown in FIG. 1 are employed and optimized for front sheet of encapsulated photovoltaic and photonic devices.

As shown in FIG. 2, an encapsulated semiconductor device (210) is coated with a multi-layer structure (220) comprising layers 221-223. The layers 221-223 can be formed of silicon dioxide ($SiO_2$) and/or PTFE, with each of the layers 221-223 having a refractive index between approximately 1.37 and 1.15. Overall, the refractive index of the structure 220 varies between approximately 1.37 and 1.15. According to an illustrative embodiment, the first layer (221) can be formed immediately adjacent to a face of the encapsulated device 210. The first layer (221) can be a nanostructured $SiO_2$ that have a thickness (t) of approximately 85 nm, a porosity of approximately 25% and a refractive index (n) of approximately 1.37. The second layer (222) can be formed immediately adjacent to the first layer (221). The second layer (222) can be a PTFE film that has a thickness of approximately 40 nm, a porosity of approximately 0% and a refractive index of approximately 1.3. The third layer (223) can be formed immediately adjacent to the second layer (222). The third layer (223) can be a nanostructured PTFE that has a thickness of approximately 120 nm, porosity of approximately 50% and a refractive index of approximately 1.15. Although specific values are provided above with respect to porosity and thickness of the layers 221-223, the values can vary by plus or minus 10%. Although specific values of refractive index are provided above, those values can vary by plus or minus 5%.

Figure 3:
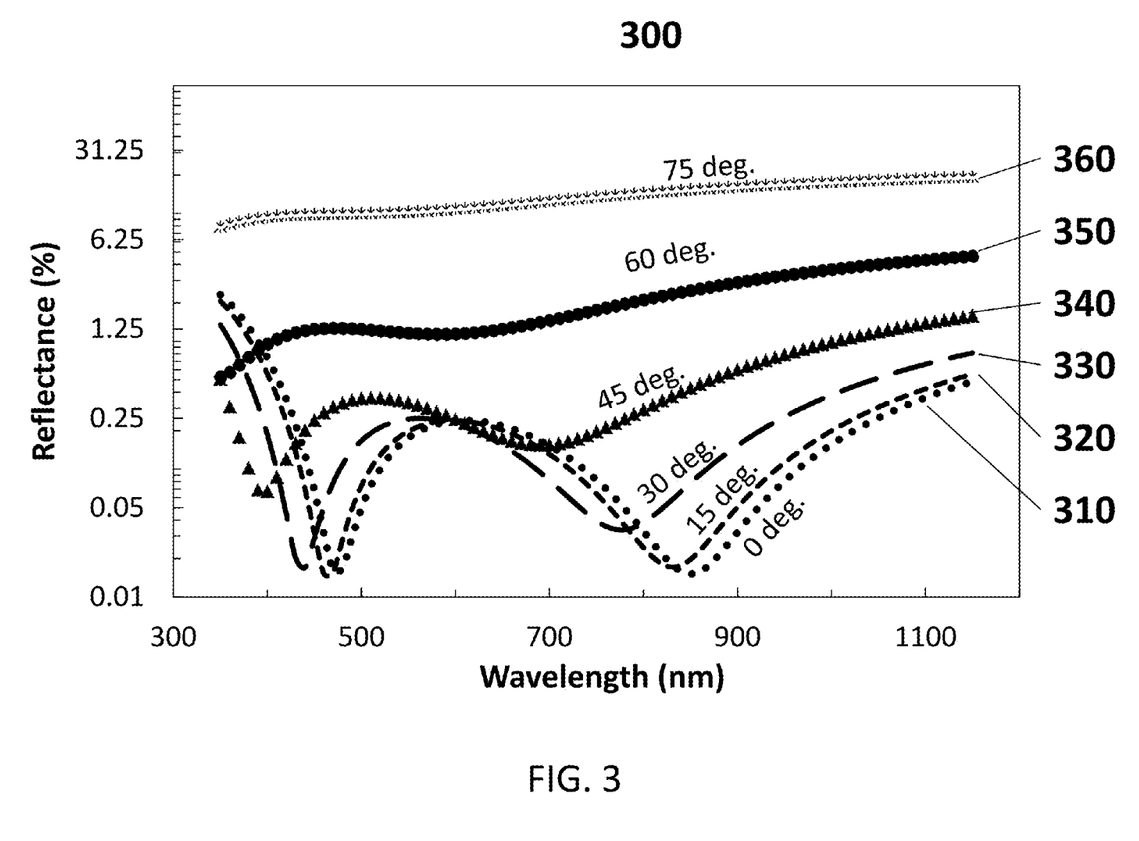
FIG. 3 is a graphical diagram showing the calculated reflectance spectra at several different incident angles from the encapsulated semiconductor device of FIG. 2, according to the illustrative embodiment.

FIG. 3 depicts a graphical diagram 300 depicting reflectance (%) vs. wavelength (nm) of the multi-layer structure (220) described above. The encapsulated device coated with the multi-layer structure (220) depicted in FIG. 2 minimizes reflectance over a broad spectrum and wide ranges of incidence angles, as shown in FIG. 3. Each line 310-360 represents reflectance (%) vs. wavelength (nm) for a particular angle of incident light. The various incident angles, respectively 0 degrees (line 310), 15 degrees (line 320), 30 degrees (line 3330), 45 degrees (line 340), 60 degrees (line 350) and 75 degrees (line 360) according to the illustrative embodiment, all exhibit significantly reduced overall reflectance compare to an uncoated substrate.

Figure 4:
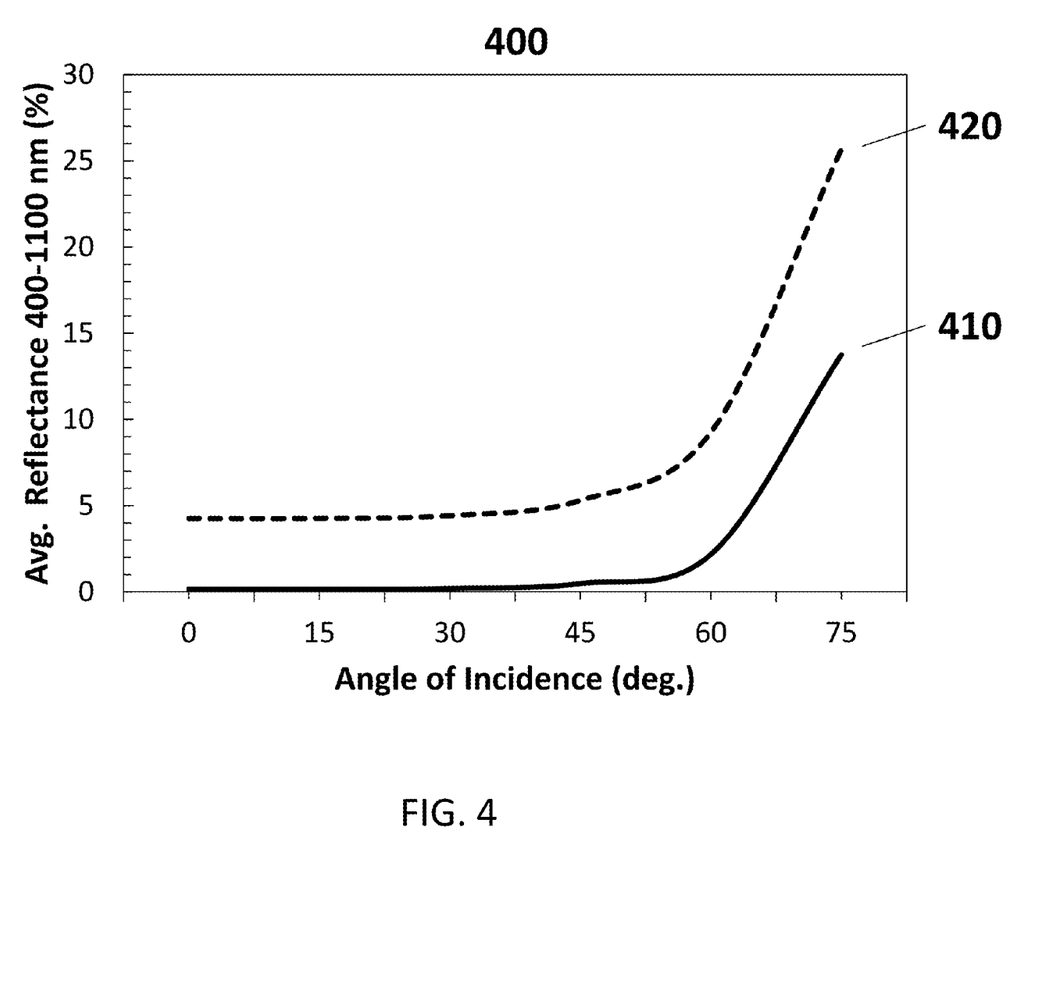
FIG. 4 is a graphical diagram showing the calculated average reflectance from 400-1100 nm at several different incident angles from un-coated and coated encapsulated semiconductor device of FIG. 2, according to the illustrative embodiment.

FIG. 4 depicts a graphical diagram depicting average calculated reflectance from 400-1100 nm vs. angle of incidence (degrees). As shown, line 410 depicts average reflectance of glass coated with the multi-layer structure (220) described above, while line (420) depicts reflectance of glass without the structure (220).

As shown in the graphical diagram 400 of FIG. 4, the average reflectance on a glass coated with a multi-layered, hydrophobic nanostructured coating (410) is significantly minimized over a conventional bare glass substrate (420). The average reflectance on glass is dramatically reduced over the entire spectrum by the application of the step-graded, nanostructured hydrophobic antireflection coating described above. While the calculations herein assume a rigid glass front sheet, similar structures can be applied to flexible, optically transparent front sheet and other structures known in the art.

Figure 5:
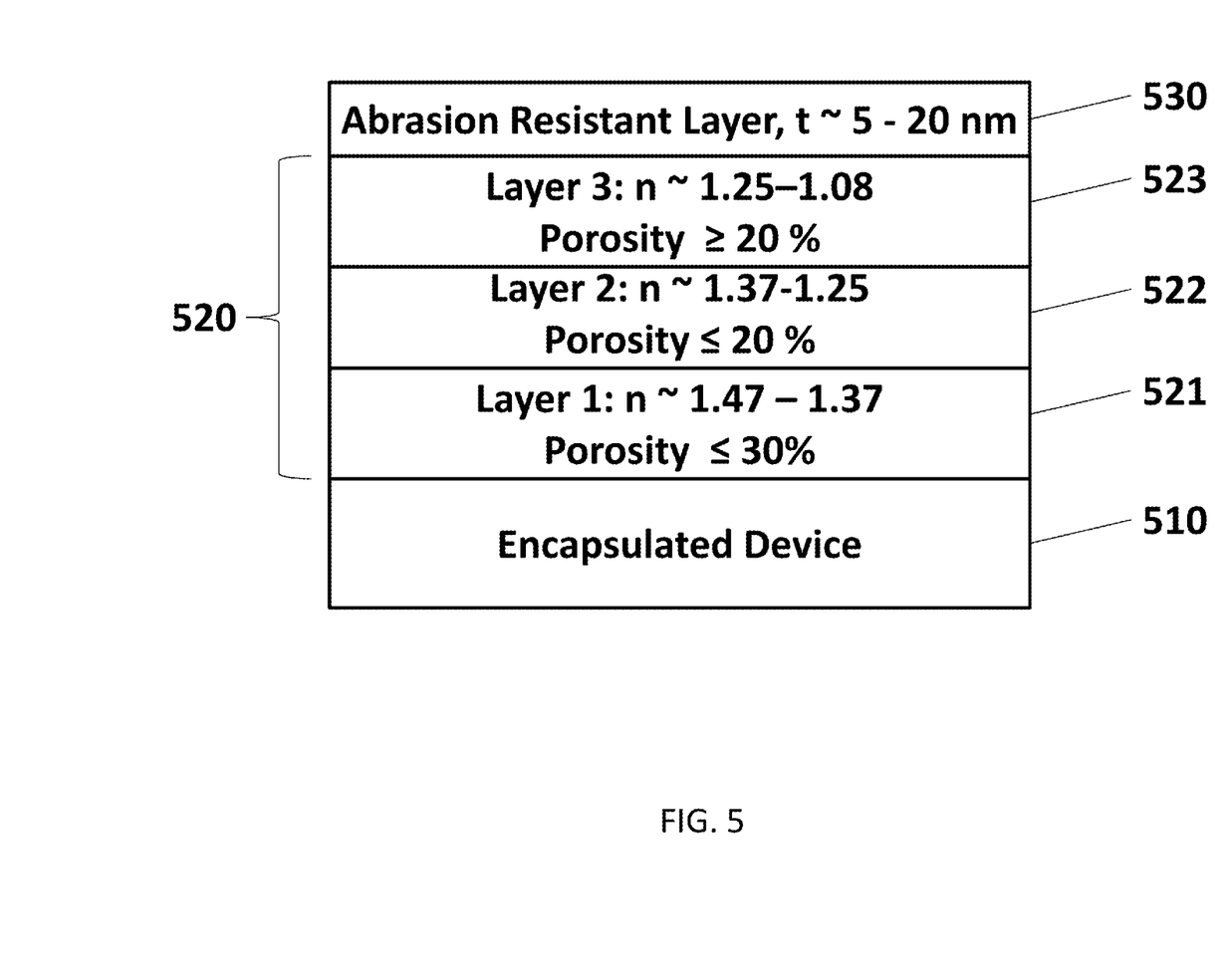
FIG. 5 is a schematic side cross-sectional view of an encapsulated semiconductor device coated with a durable multi-layer structure, with top nonporous layer of abrasion resistant and/or hydrophobic coating, according to an illustrative embodiment.

In another embodiment, as shown in FIG. 5, an encapsulated semiconductor device (510) is coated with a durable abrasion resistant multi-layer structure (520) comprised of silicon dioxide ($SiO_2$) and low-index-material that demonstrate less than 1% changes in haze or optical transmittance after EN 1096-2 standard abrasion stress. According to an illustrative embodiment, Layer 1 (521) of the multi-layer structure is a nanostructured $SiO_2$ that have a refractive index between 1.47 and 1.37, and a porosity of less than 30%. Layer 2 (522) is a nonporous or nanostructured low-index-material film that have a refractive index between 1.37 and 1.25, and a porosity of less than 20%. Layer 3 (523) is a nanostructured low-index-material that have refractive index between 1.25 and 1.08, and a porosity greater than 20%. A topmost layer 530 of nonporous material, e.g., having a porosity of 0% and having no pores, is typically coated on the top of the antireflection structure, having a thickness of approximately 5-20 nm, which functions as an abrasion resistant and hydrophobic coating. The low-index-materials are $MgF_2$ (n~1.38), $AlF_3$ (n~1.36), LiF (n~1.36), Cryolite (n~1.35), Chiolite (n~1.33), PTFE and other materials known in the art. The abrasion resistant materials are $Al_2O_3$, $SiO_2$, $PTFE/Al_2O_3$ composite, $PTFE/SiO_2$ composite and other materials known in the art. The thickness of each layer can be optimized to achieve desire antireflective properties.

Figure 6:
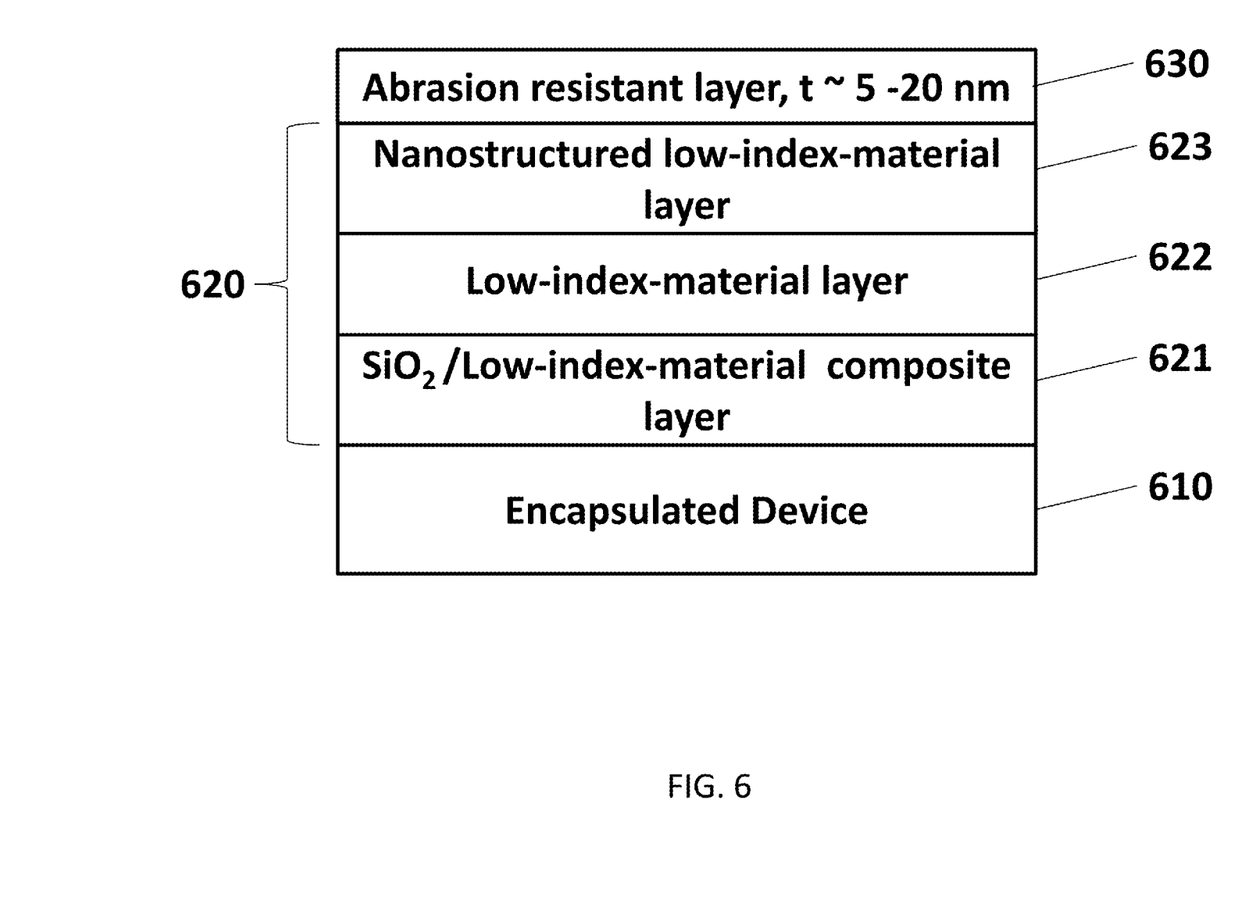
FIG. 6 is a schematic side cross-sectional view of an encapsulated semiconductor device coated with an alternate durable multi-layer structure, with top nonporous layer of abrasion resistant and/or hydrophobic coating, according to an illustrative embodiment.

In another embodiment, as shown in FIG. 6, an encapsulated semiconductor device (610) is coated with a durable multi-layer structure (620) comprised of silicon dioxide ($SiO_2$) and a low index material. According to an illustrative embodiment, the first layer (621) of the multi-layer structure is a $SiO_2$/low-index-material composite layer that has porosity 0% and refractive index approximately 1.37. The second layer (622) is a porous or non-porous low-index-material film that has a porosity of less than 20% and refractive index approximately 1.3. The third layer (623) is a nanostructured low-index-material that has porosity greater than 20% and a refractive index of approximately 1.15. A topmost layer 630 of nonporous material is typically coated on the top of the antireflection structure, having a thickness of approximately 5-20 nm, which functions as hydrophobic, exhibiting water contact angle greater than 130 degrees, and an abrasion resistant coating that demonstrate less than 1% changes in haze or optical transmittance after EN 1096-2 standard abrasion stress. The low-index-materials are PTFE (n~1.3), $MgF_2$ (n~1.38), $AlF_3$ (n~1.36), LiF (n~1.36), Cryolite (n~1.35), Chiolite (n~1.33) and other materials known in the art. The abrasion resistant materials are $Al_2O_3$, $SiO_2$, $PTFE/Al_2O_3$ composite, $PTFE/SiO_2$ composite, and other materials known in the art. The composite material layer can be obtained by co-evaporation, co-sputtering and other technique known in the art, with desired rate of deposition of individual component to achieve the desired material ratio. The thickness of each layer can be further optimized to achieve desire antireflective properties.

Figure 7:
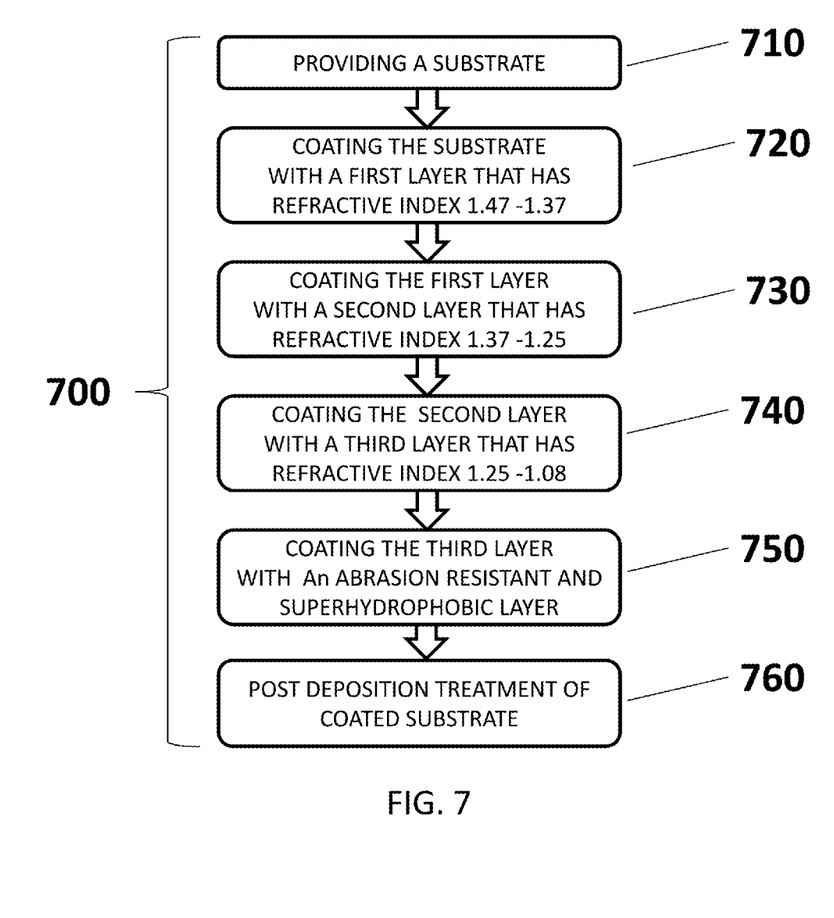
FIG. 7 is a flow chart of a procedure for fabricating a durable hydrophobic antireflection structure, according to an illustrative embodiment.

Reference is now made to FIG. 7 showing a flow chart of a procedure 700 for fabricating a durable hydrophobic antireflection structure according to an illustrative embodiment. As shown, at the step 710, a substrate is provided. The substrate can comprise a transparent front sheet for a device, front sheet encapsulated device, optical elements, optical windows and other substrate known in the art. The device comprises optical sensors, photovoltaic device, display devices, photonic devices and other devices known in the art. At step 720, the substrate is then over-coated with a first layer. The first layer deposited or otherwise coated on the substrate at step 720 comprises a nonporous or nanostructured layer of refractive index between 1.47 and 1.37, and porosity less than 20%. The nonporous or nanostructured layer can include nonporous layer of $SiO_2$, porous-layer of $SiO_2$ with porosity less than 30%, nonporous layer of $CaF_2$, porous-layer of $CaF_2$ with porosity less than 30%, composite layer of $SiO_2$ and low-index-material, and other layer known in the art, wherein low-index-material comprises at least one of $MgF_2$, LiF, $AlF_3$, Cryolite, Chiolite, PTFE and other material known to those ordinarily skilled in the art; and the porous-layer comprise of nanostructured layer with desire porosity deposited by oblique angle deposition technique or other technique known to those ordinarily skilled in the art. At step 730, the first layer is over-coated with a second layer. The second layer deposited or otherwise coated on the first layer at step 730 comprises a nonporous or nanostructured layer of refractive index between 1.37 and 1.25, and porosity less than 20%. The nonporous or nanostructured layer can include composite layer of $SiO_2$ and low-index-material, nonporous layer of low-index-material, porous-layer of low-index-material with porosity less than 20%, and other layers known to those ordinarily skilled in the art, wherein low-index-material comprises at least one of $MgF_2$, LiF, $AlF_3$, Cryolite, Chiolite, PTFE and other material known to those ordinarily skilled in the art; and the porous-layer comprise of nanostructured layer with desire porosity deposited by oblique angle deposition technique or other technique known to those ordinarily skilled in the art. At step 740, the second layer is over-coated with a third layer. The third layer deposited or otherwise coated on the second layer at step 740 comprises a nanostructured layer of refractive index between 1.25 and 1.08, and porosity greater than 20%. The nanostructured layer can include porous-layer of low-index-material with porosity greater than 20%, and other layer known to those ordinarily skilled in the art, wherein low-index-material comprises at least one of $MgF_2$, LiF, $AlF_3$, Cryolite, Chiolite, PTFE and other material known to those ordinarily skilled in the art; and the porous-layer comprise of nanostructured layer with desire porosity deposited by oblique angle deposition technique or other technique known to those ordinarily skilled in the art. At step 750, the third layer is over-coated with an abrasion resistant and hydrophobic layer. The abrasion resistant and hydrophobic layer deposited or otherwise coated on the third layer at step 750 comprises a top nonporous layer comprising at least one of $SiO_2$ layer, $Al_2O_3$ layer, PTFE layer, PTFE/$SiO_2$ composite layer, PTFE/$Al_2O_3$ composite layer and other material layer known to those ordinarily skilled in the art, having a thickness of approximately 5-20 nm. Finally, at step 960, the coated substrate is subjected to one or more post deposition treatments. The post deposition treatment at step 760 comprises a reliability enhancing treatment comprising at least one of thermal treatment at desire ambient and temperature, plasma treatment at desired temperature, and other treatment known in the art.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. For example, the illustrative embodiments can include additional layers to perform further functions or enhance existing, described functions. Likewise, while not shown, the electrical connectivity of the cell structure with other cells in an array and/or an external conduit is expressly contemplated and highly variable within ordinary skill. More generally, while some ranges of layer thickness and illustrative materials are described herein. It is expressly contemplated that additional layers, layers having differing thicknesses and/or material choices can be provided to achieve the functional advantages described herein. In addition, directional and locational terms such as "top", "bottom", "center", "front", "back", "above", and "below" should be taken as relative conventions only, and not as absolute. Furthermore, it is expressly contemplated that various semiconductor and thin films fabrication techniques can be employed to form the structures described herein. Accordingly, this description is meant to be taken only by way of example, and not to otherwise limit the scope of this invention.

What is claimed is:

1. A hydrophobic anti-reflection coating configured to be disposed on a surface of a substrate comprising:
    a step-graded structure comprising a plurality of layers of transparent materials, wherein each of the plurality of layers has a refractive index between a refractive index of the substrate and a refractive index of ambient air;
    the plurality of layers comprising:
        a first layer of nanostructured $SiO_2$ having a thickness of approximately 85 nm, a porosity of approximately 25%, and a refractive index of approximately 1.37;
        a second layer of Polytetrafluoroethylene (PTFE) film having a thickness of approximately 40 nm, a porosity of approximately 0%, and a refractive index of approximately 1.3; and
        a third layer of nanostructured PTFE having a thickness of approximately 120 nm, a porosity of approximately 50%, and a refractive index of approximately 1.15.

2. The coating of claim 1, further comprising:
    a top nonporous layer comprising at least one of: a $SiO_2$ layer; an $Al_2O_3$ layer; a PTFE layer; a composite of PTFE and $SiO_2$; a composite of PTFE and $Al_2O_3$, and
    wherein the top nonporous layer has a thickness of approximately 5-20 nm and is configured to be a hydrophobic, exhibiting water contact angle greater than 130 degrees, and abrasion resistant coating that demonstrate less than 1% changes in haze or optical transmittance after EN 1096-2 standard abrasion stress.

3. The coating of claim 1, wherein the substrate comprises of at least one of: an optical element; an optical window; a front sheet of a photovoltaic device; a front sheet of a display device; and a retrofit sheet for an optical device.

* * * * *